US012757395B2

(12) United States Patent
Lin

(10) Patent No.: US 12,757,395 B2
(45) Date of Patent: Oct. 6, 2026

(54) SEMICONDUCTOR DEVICE AND MANUFACTURING METHOD THEREOF

(71) Applicant: NANYA TECHNOLOGY CORPORATION, New Taipei City (TW)

(72) Inventor: Chih-Ching Lin, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 637 days.

(21) Appl. No.: 18/196,730

(22) Filed: May 12, 2023

(65) Prior Publication Data

US 2024/0381636 A1 Nov. 14, 2024

(51) Int. Cl.
*H10B 41/42* (2023.01)

(52) U.S. Cl.
CPC .................................... *H10B 41/42* (2023.02)

(58) Field of Classification Search
CPC ...................................................... H10B 41/42
See application file for complete search history.

(56) References Cited

U.S. PATENT DOCUMENTS 8,901,632 B1 * 12/2014 Perera .................... H10B 41/43 438/266
9,583,640 B1 * 2/2017 Richter .................. H10B 41/42
10,879,253 B2 * 12/2020 Wu ........................ H10B 41/30
2004/0209429 A1 * 10/2004 Lin ...................... H10B 12/485 257/E21.507
2007/0020866 A1 * 1/2007 Cheng .................. H10D 30/792 438/301
2007/0057317 A1 * 3/2007 Weng ..................... H10B 41/42 257/E27.103
2009/0268500 A1 * 10/2009 Fang ...................... G11C 5/063 438/129
2010/0055914 A1 * 3/2010 Min ................... G11C 16/0483 438/700

(Continued)

FOREIGN PATENT DOCUMENTS

CN 101164147 A * 4/2008 .......... H10P 76/4088
CN 100550353 C * 10/2009 ............. H10B 41/40

(Continued)

OTHER PUBLICATIONS

CN 101164147 (Year: 2008).*
CN 100550353 (Year: 2009).*

*Primary Examiner* — Sue A Purvis
(74) *Attorney, Agent, or Firm* — CKC & Partners Co., LLC

(57) ABSTRACT

A semiconductor device includes a substrate, a first film stack, a second film stack, a first gate spacer, a buffer layer, and a second gate spacer. The first and second film stacks are located on the substrate, and are respectively located in an array area and a periphery area. The first gate spacer includes a first portion on a sidewall of the first film stack and a second portion on a sidewall of the second film stack. The buffer layer includes a first portion on a sidewall of the first portion of the first gate spacer and a second portion on a sidewall of the second portion of the first gate spacer. The second gate spacer includes a first portion on a sidewall of the first portion of the buffer layer and a second portion on a sidewall the second portion of the buffer layer.

12 Claims, 7 Drawing Sheets

(56) References Cited

U.S. PATENT DOCUMENTS

| | | | | |
|---|---|---|---|---|
| 2010/0155959 | A1* | 6/2010 | Park | H10B 41/10 438/669 |
| 2014/0239367 | A1* | 8/2014 | Saito | H10B 43/30 438/266 |
| 2015/0187783 | A1* | 7/2015 | Chuang | H10B 41/42 257/314 |
| 2017/0084622 | A1* | 3/2017 | Hsu | H10B 41/41 |
| 2023/0113028 | A1* | 4/2023 | Choi | H10B 12/30 257/295 |

FOREIGN PATENT DOCUMENTS

| | | | |
|---|---|---|---|
| TW | 200703562 | A | 1/2007 |
| TW | 202316631 | A | 4/2023 |

* cited by examiner

SEMICONDUCTOR DEVICE AND MANUFACTURING METHOD THEREOF

BACKGROUND

Field of Invention

The present disclosure relates to a semiconductor device and a manufacturing method of the semiconductor device.

Description of Related Art

With the rapid development of integrated circuit technology, component miniaturization and integration is an important trend and topic in the electronics industry today.

During the manufacture of a semiconductor device related to a memory, two film stacks may be formed on a substrate, in which the two film stacks are respectively in an array area and a periphery area of the semiconductor device. A spacer dielectric layer is formed to cover the two film stacks and the substrate. Thereafter, the spacer dielectric layer may be etched until the top surface of the substrate between the two film stacks is exposed, thereby defining gate spacers respectively on the sidewalls of the two film stacks. However, the periphery area of the semiconductor device is small, which causes an etch point detection (EPD) signal to be week.

Moreover, in order to ensure the top surface of the substrate is exposed and to enhance the etch point detection signal, etching the spacer dielectric layer is performed such that the underlying hard mask layer of the film stack in the array area is also etched. Although the EPD signal can be enhanced due to the array area much larger than the periphery area, the remaining thickness of the hard mask layer of the film stack in the array area would impact the accuracy of the EPD signal, which results in unstable the thickness of the gate spacer. Accordingly, the saturation current (Idsat) of the semiconductor device will be unstable to affect electrical properties.

SUMMARY

One aspect of the present disclosure provides a semiconductor device.

According to some embodiments of the present disclosure, a semiconductor device includes a substrate, a first film stack, a second film stack, a first gate spacer, a buffer layer, and a second gate spacer. The first film stack is located on the substrate and located in an array area of the semiconductor device. The second film stack is located on the substrate and located in a periphery area of the semiconductor device. The first gate spacer includes a first portion on a sidewall of the first film stack and a second portion on a sidewall of the second film stack. The buffer layer includes a first portion on a sidewall of the first portion of the first gate spacer and a second portion on a sidewall of the second portion of the first gate spacer. The second gate spacer includes a first portion on a sidewall of the first portion of the buffer layer and a second portion on a sidewall the second portion of the buffer layer, wherein the first portion of the buffer layer is located between the first portion of the first gate spacer and the first portion of the second gate spacer, and the second portion of the buffer layer is located between the second portion of the first gate spacer and the second portion of the second gate spacer.

In some embodiments, the first portion of the buffer layer is in contact with the first portion of the first gate spacer and the first portion of the second gate spacer.

In some embodiments, the second portion of the buffer layer is in contact with the second portion of the first gate spacer and the second portion of the second gate spacer.

In some embodiments, a material of the buffer layer is different from a material of the second gate spacer.

In some embodiments, the material of the buffer layer includes nitride, and the material of the second gate spacer includes oxide.

In some embodiments, the material of the buffer layer is the same as a material of the first gate spacer.

In some embodiments, the material of the first gate spacer includes nitride.

In some embodiments, each of the first film stack and the second film stack includes a poly layer, a metal stack, a dielectric layer, and a hard mask layer that are stacked in sequence.

In some embodiments, a material of the hard mask layer comprises oxide.

In some embodiments, a material of the hard mask layer is the same as a material of the second gate spacer.

In some embodiments, a material of the hard mask layer is different from a material of the buffer layer.

In some embodiments, the substrate includes a plurality of shallow trench isolation structures therein.

Another aspect of the present disclosure provides a manufacturing method of a semiconductor device.

According to some embodiments of the present disclosure, a manufacturing method of a semiconductor device includes forming a first film stack and a second film stack on a substrate, wherein the first film stack is located in an array area of the semiconductor device, and the second film stack is located in a periphery area of the semiconductor device; forming a first portion and a second portion of a first gate spacer respectively on a sidewall of the first film stack and a sidewall of the second film stack; forming a buffer layer to cover the first film stack, the first portion and the second portion of the first gate spacer, the substrate, and the second film stack, wherein the buffer layer includes a first portion on a sidewall of the first portion of the first gate spacer and a second portion on a sidewall of the second portion of the first gate spacer; forming a spacer dielectric layer to cover the buffer layer; etching the spacer dielectric layer to expose the buffer layer and to define a second gate spacer, wherein the second gate spacer includes a first portion on a sidewall of the first portion of the buffer layer and a second portion on a sidewall the second portion of the buffer layer, and the first portion of the buffer layer is located between the first portion of the first gate spacer and the first portion of the second gate spacer, and the second portion of the buffer layer is located between the second portion of the first gate spacer and the second portion of the second gate spacer; and etching the exposed buffer layer to expose a top surface of the first film stack, a top surface of the second film stack, and a top surface of the substrate between the first film stack and the second film stack.

In some embodiments, etching the spacer dielectric layer is performed such that regions of the buffer layer respectively overlapping the top surface of the first film stack, the top surface of the second film stack, and the top surface of the substrate between the first film stack and the second film stack are exposed.

In some embodiments, etching the spacer dielectric layer includes using the buffer layer as an etch stop layer.

In some embodiments, forming the first film stack and the second film stack on the substrate includes forming a poly layer, a metal stack, and a dielectric layer on the substrate in sequence; and patterning the poly layer, the metal stack, and the dielectric layer using a hard mask layer to define the first film stack and the second film stack.

In some embodiments, etching the exposed buffer layer includes using the hard mask layer as an etch stop layer.

In some embodiments, the buffer layer and the spacer dielectric layer include different materials.

In some embodiments, the hard mask layer and the buffer layer include different materials.

In some embodiments, after etching the exposed buffer layer, the first portion of the buffer layer has a bottom portion between the first portion of the second gate spacer and the substrate, and the second portion of the buffer layer has a bottom portion between the second portion of the second gate spacer and the substrate.

In the aforementioned embodiments of the present disclosure, since the buffer layer is formed to cover the first film stack, the first portion and the second portion of the first gate spacer, the substrate, and the second film stack after forming the first gate spacer and before forming the spacer dielectric layer, the buffer layer can be serve as an etch stop layer when etching the spacer dielectric layer. After the spacer dielectric layer is etched to form the second gate spacer, the buffer layer in the array area and the periphery area of the semiconductor device can enable etch point detection (EPD) to catch with strong signal because the exposed buffer layer may occupy about 100% of the array area and the periphery area. In addition, after the formation of the second gate spacer, the exposed buffer layer can be etched to expose the first film stack, the second film stack, and the substrate between the first film stack and the second film stack, and thus the hard mask layer of the first film stack and the hard mask layer of the second film stack are maintained without needing to be removed. As a result, the thickness of the hard mask layer does not impact the accuracy of the EPD, and the thickness of the second gate spacer can be precisely controlled due to no over etching. Accordingly, the saturation current (Idsat) of the semiconductor device is stable to improve electrical properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
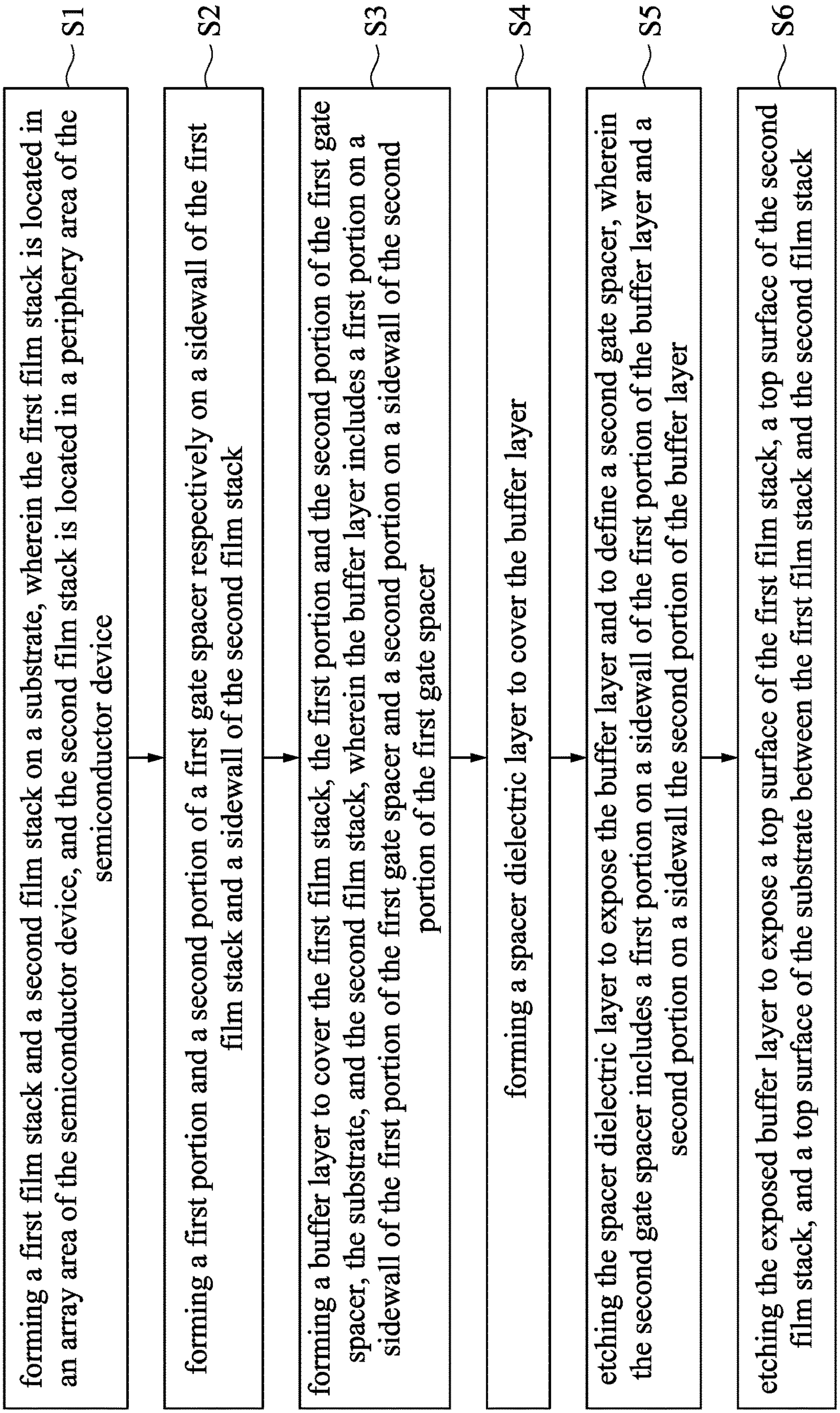
FIG. 1 is a flow chart of a manufacturing method of a semiconductor device according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a manufacturing method of a semiconductor device according to one embodiment of the present disclosure. The manufacturing method of the semiconductor device includes the following steps. In step S1, a first film stack and a second film stack are formed on a substrate, wherein the first film stack is located in an array area of the semiconductor device, and the second film stack is located in a periphery area of the semiconductor device. Thereafter, in step S2, a first portion and a second portion of a first gate spacer are respectively formed on a sidewall of the first film stack and a sidewall of the second film stack. Afterwards, in step S3, a buffer layer is formed to cover the first film stack, the first portion and the second portion of the first gate spacer, the substrate, and the second film stack, wherein the buffer layer includes a first portion on a sidewall of the first portion of the first gate spacer and a second portion on a sidewall of the second portion of the first gate spacer. Next, in step S4, a spacer dielectric layer is formed to cover the buffer layer. Thereafter, in step S5, the spacer dielectric layer is etched to expose the buffer layer and to define a second gate spacer, wherein the second gate spacer includes a first portion on a sidewall of the first portion of the buffer layer and a second portion on a sidewall the second portion of the buffer layer. Subsequently, in step S6, the exposed buffer layer is etched to expose a top surface of the first film stack, a top surface of the second film stack, and a top surface of the substrate between the first film stack and the second film stack.

The manufacturing method of the semiconductor device is not limited to the above steps S1 to S6. For example, in some embodiments, the manufacturing method may further include other steps between two of the above steps, and may further include other steps before step S1 and after step S5. Moreover, each of steps S1 to S6 may include more detailed steps. In the following description, the aforementioned steps of the manufacturing method of the semiconductor device will be explained.

Figure 2:
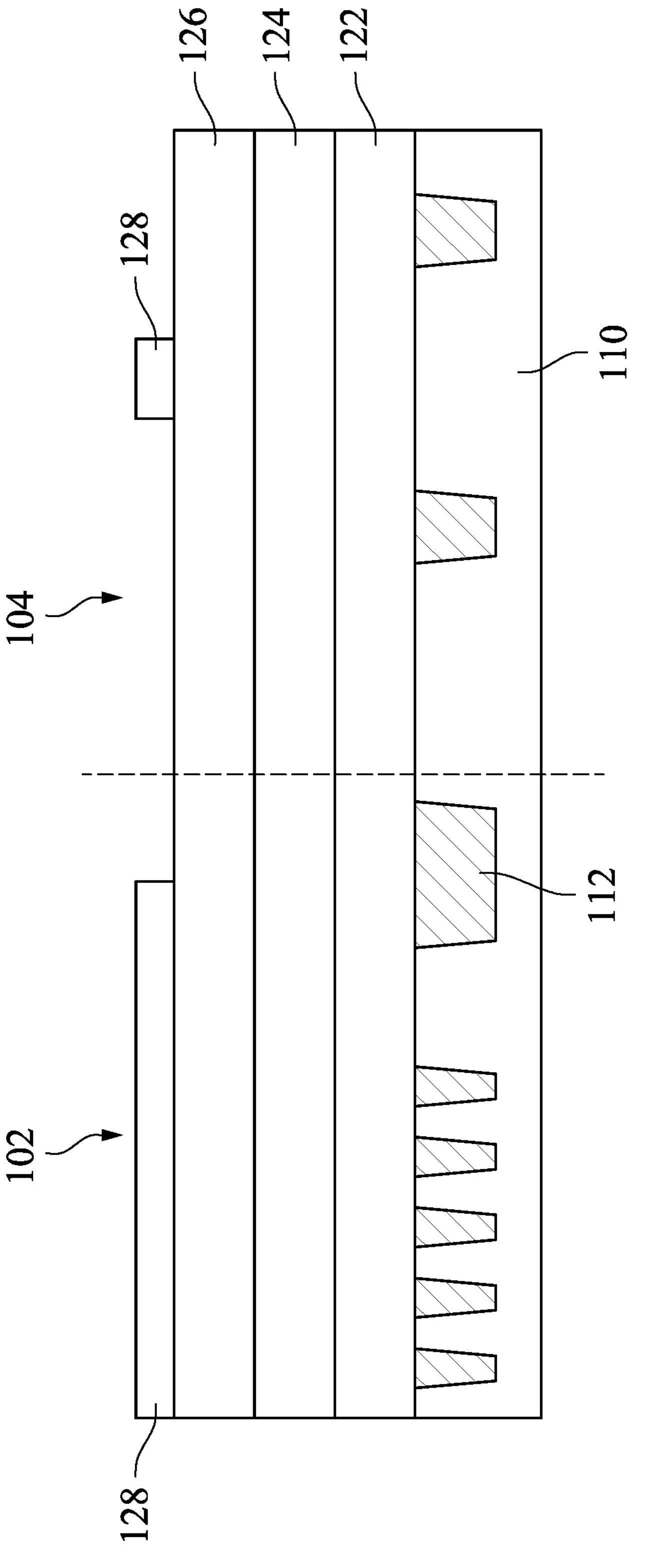
FIGS. 2-7 are cross-sectional views at intermediate stages of a manufacturing method of a semiconductor device according to one embodiment of the present disclosure.

FIGS. 2-7 are cross-sectional views at intermediate stages of a manufacturing method of a semiconductor device 100 (see FIG. 7) according to one embodiment of the present disclosure. As shown in FIG. 2, the substrate 110 includes a plurality of shallow trench isolation structures 112 therein. The shallow trench isolation structures 112 may be made of oxide or nitride, such as silicon oxide or silicon nitride. A poly layer 122, a metal stack 124, and a dielectric layer 126 are formed on the substrate 110 in sequence. In addition, a patterned hard mask layer 128 is formed on the dielectric layer 126. The metal stack 124 is located between the poly layer 122 and the dielectric layer 126. In some embodiments, the material of the dielectric layer 126 may be silicon nitride. In addition, an array area 102 is present at the left side of the dotted line of FIG. 2, and a periphery area 104 is present at the right side of the dotted line of FIG. 2. The array area 102 is larger than the periphery area 104, and the array area 102 may be used to form memory transistors.

Figure 3:
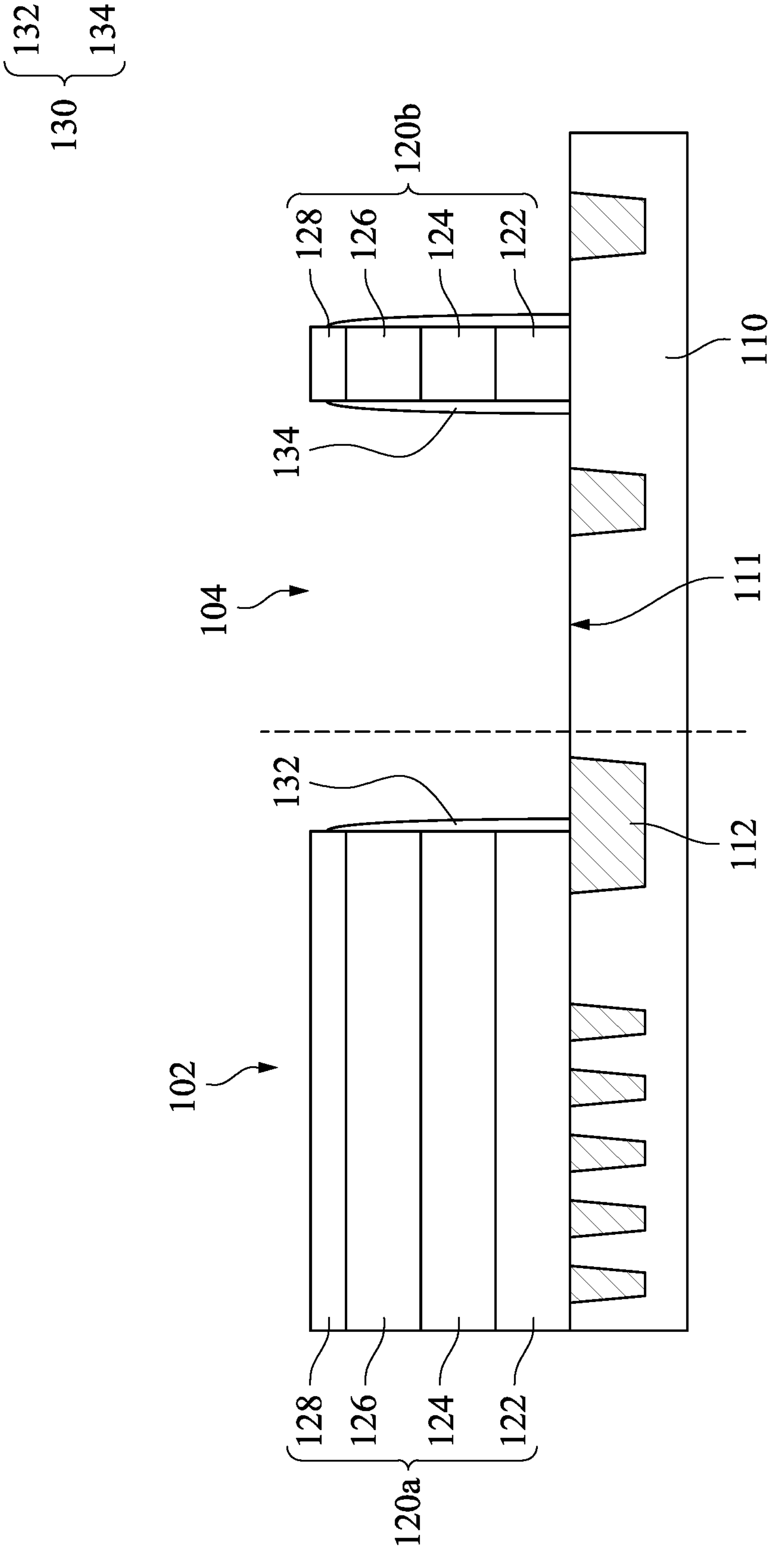

Referring to FIG. 3, thereafter, the poly layer 122, the metal stack 124, and the dielectric layer 126 are patterned using the hard mask layer 128 to form two separated portions respectively in the array area 102 and the periphery area 104, and thus a first film stack 120*a* and a second film stack 120*b* can be defined and portions of a top surface 111 of the substrate 110 can be exposed. The material of the hard mask layer 128 may be oxide, such as silicon oxide. As a result, the first film stack 120*a* and the second film stack 120*b* are formed on the substrate 110, in which the first film stack 120*a* is located in the array area 102, and the second film stack 120*b* is located in the periphery area 104. After the formation of the first film stack 120*a* and the second film stack 120*b*, a first portion 132 and a second portion 134 of a first gate spacer 130 are respectively formed on the sidewall of the first film stack 120*a* and the sidewall of the second film stack 120*b*. The material of the first gate spacer 130 may be nitride, such as silicon nitride.

Figure 4:
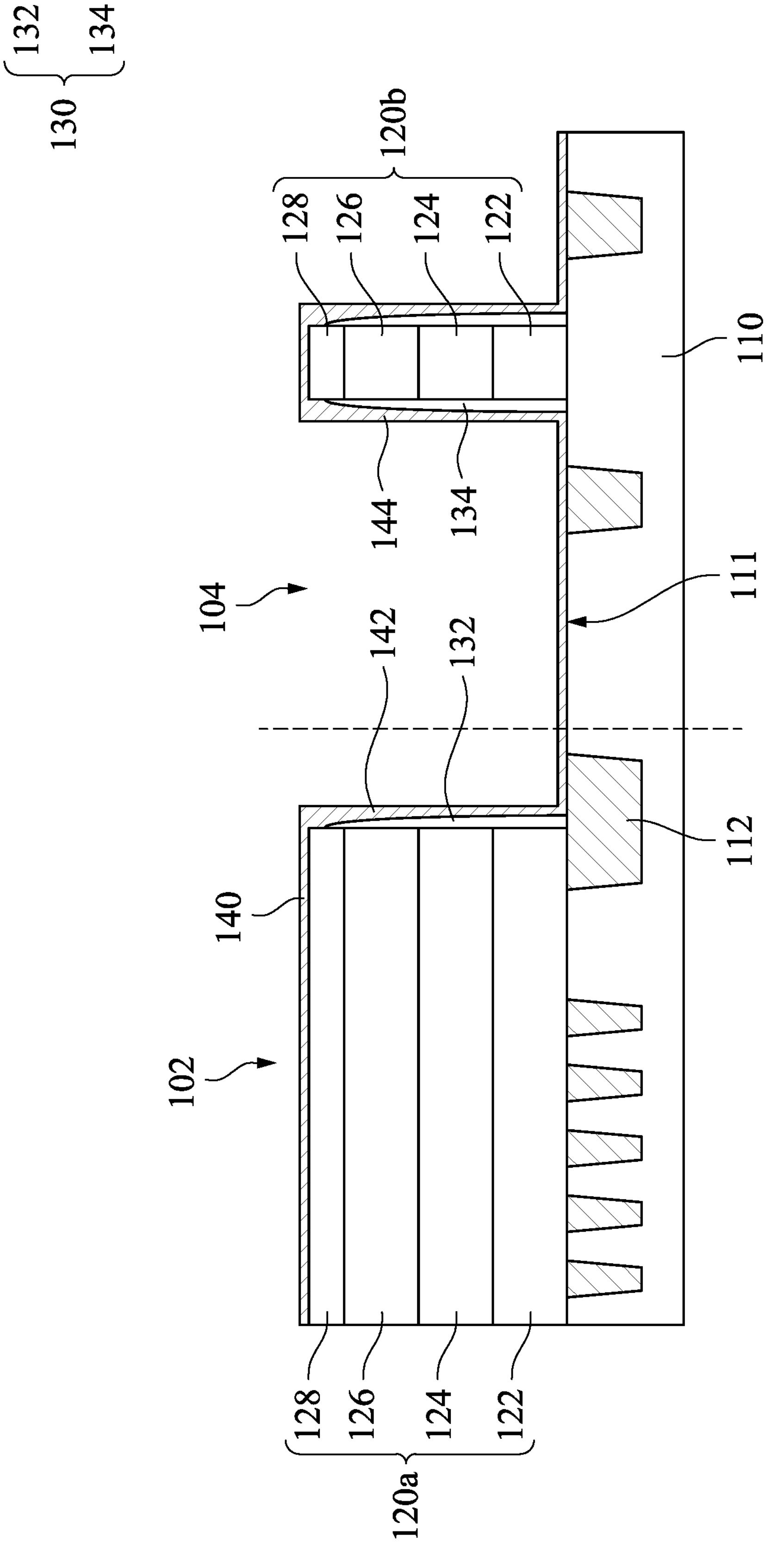

As shown in FIG. 4, a buffer layer 140 is formed to cover the first film stack 120*a*, the first portion 132 and the second portion 134 of the first gate spacer 130, the top surface 111 of the substrate 110, and the second film stack 120*b*. The buffer layer 140 includes a first portion 142 on the sidewall of the first portion 132 of the first gate spacer 130, and includes a second portion 144 on the sidewall of the second portion 134 of the first gate spacer 130. In some embodiments, the material of the buffer layer 140 is the same as a material of the first gate spacer 130, and is different from the material of the hard mask layer 128. For example, the material of the buffer layer 140 may be nitride, such as silicon nitride. The buffer layer 140 can be formed by chemical vapor deposition (CVD) or any other suitable process.

Figure 5:
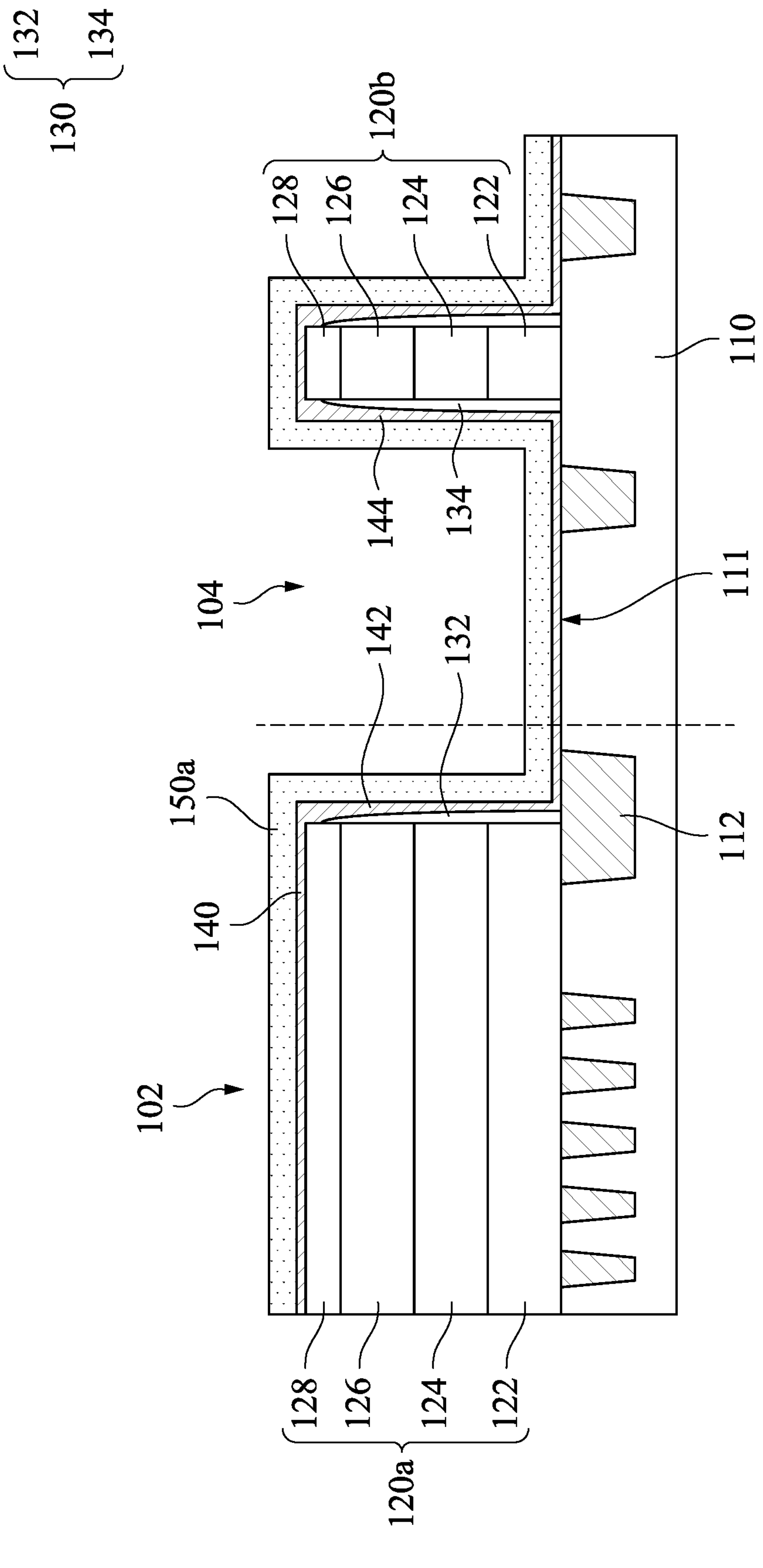
Figure 6:
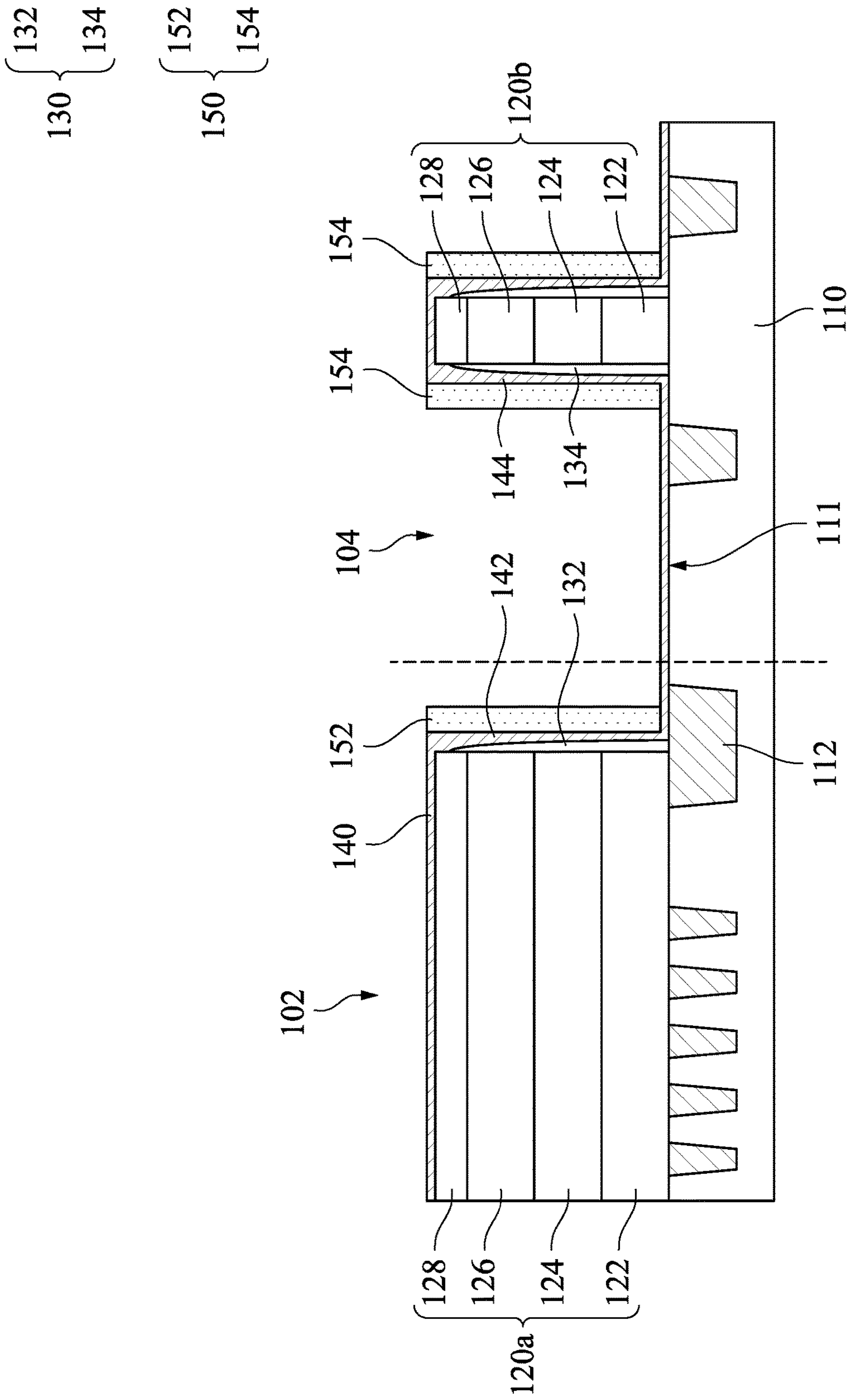

As shown in FIGS. 5 and 6, after the formation of the buffer layer 140, a spacer dielectric layer 150*a* is formed to cover the buffer layer 140. Thereafter, the spacer dielectric layer 150*a* is etched to expose the buffer layer 140 and to define a second gate spacer 150, in which the second gate spacer 150 includes a first portion 152 on the sidewall of the first portion 142 of the buffer layer 140, and includes a second portion 154 on the sidewall the second portion 144 of the buffer layer 140. In addition, etching the spacer dielectric layer 150*a* is performed such that regions of the buffer layer 140 respectively overlapping the top surface of the first film stack 120*a*, the top surface of the second film stack 120*b*, and the top surface of the substrate 110 between the first film stack 120*a* and the second film stack 120*b* are exposed. Stated in another way, most of the top surface of the buffer layer 140 in the array area 102 and the periphery area 104 is exposed. The buffer layer 140 and the spacer dielectric layer 150*a* include different materials. For example, the material of the spacer dielectric layer 150*a* includes oxide, such as silicon oxide. In such a design, the buffer layer 140 can be used as an etch stop layer during etching the spacer dielectric layer 150*a*.

Figure 7:
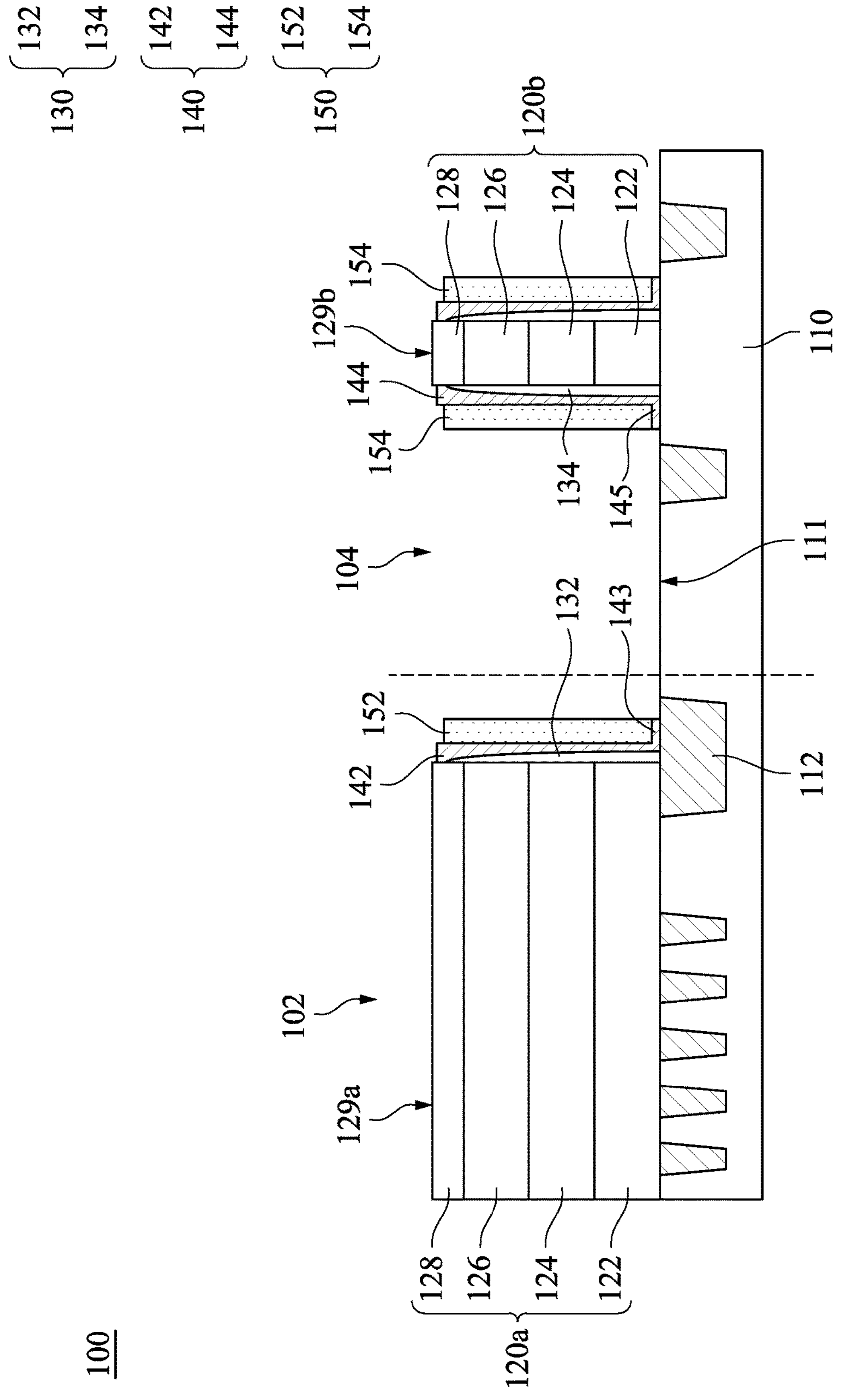

As shown in FIG. 7. after the spacer dielectric layer 150*a* is etched, the exposed buffer layer 140 of FIG. 6 is etched to expose a top surface 129*a* of the first film stack 120*a*, a top surface 129*b* of the second film stack 120*b*, and the top surface 111 of the substrate 110 that is between the first film stack 120*a* and the second film stack 120*b* (or between the first portion 152 and the second portion 154 of the second gate spacer 150). Because the hard mask layer 128 and the buffer layer 140 include different materials, the hard mask layer 128 can be used as an etch stop layer during etching the exposed buffer layer 140 of FIG. 6. In addition, since the material of the buffer layer 140 is different from the material of the first portion 152 and the second portion 154 of the second gate spacer 150, the thickness of the first portion 152 and the second portion 154 of the second gate spacer 150 can be maintained during etching the buffer layer 140. Moreover, since the material of the buffer layer 140 is different from the material of the hard mask layer 128, the hard mask layer 128 of the first film stack 120*a* and the hard mask layer 128 of the second film stack 120*b* can also be maintained during etching the buffer layer 140. Though the aforementioned steps, the semiconductor device 100 of FIG. 7 can be obtained. In some embodiments, the first film stack 120*a* may be used to manufacture a memory transistor, and the second film stack 120*b* may be a gate structure.

Specifically, since the buffer layer 140 (see FIG. 4) is formed to cover the first film stack 120*a*, the first portion 132 and the second portion 134 of the first gate spacer 130, the substrate 110, and the second film stack 120*b* after forming the first gate spacer 130 (see FIG. 3) and before forming the spacer dielectric layer 150*a* (see FIG. 5), the buffer layer 140 can be serve as an etch stop layer when etching the spacer dielectric layer 150*a*. After the spacer dielectric layer 150*a* is etched to form the second gate spacer 150, the buffer layer 140 in the array area 102 and the periphery area 104 of the semiconductor device 100 can enable etch point detection (EPD) to catch with strong signal because the exposed buffer layer 140 may occupy about 100% of the array area 102 and the periphery area 104. In addition, after the formation of the second gate spacer 150, the exposed buffer layer 140 can be etched to expose the first film stack 120*a*, the second film stack 120*b*, and the substrate 110 between the first film stack 120*a* and the second film stack 120*b*, and thus the hard mask layer 128 of the first film stack 120*a* and the hard mask layer 128 of the second film stack 120*b* are maintained without needing to be removed. As a result, the thickness of the hard mask layer 128 does not impact the accuracy of the EPD, and the thickness of the second gate spacer 150 can be precisely controlled due to no over etching. Accordingly, the saturation current (Idsat) of the semiconductor device 100 is stable to improve electrical properties.

In some embodiment, after etching the exposed buffer layer 140, the first portion 142 of the buffer layer 140 has a bottom portion 143 between the first portion 152 of the second gate spacer 150 and the substrate 110, and the second portion 144 of the buffer layer 140 has a bottom portion 145 between the second portion 154 of the second gate spacer 150 and the substrate 110.

It is to be noted that the connection relationships, the materials, and the advantages of the elements described above will not be repeated in the following description. In the following description, the structure of the semiconductor device 100 of FIG. 7 will be described in detail.

Referring to FIG. 7, the semiconductor device 100 includes the substrate 110, the first film stack 120*a*, the second film stack 120*b*, the first gate spacer 130, the buffer layer 140, and the second gate spacer 150. The first film stack 120*a* is located on the substrate 110 and located in the array area 102 of the semiconductor device 100. The second film stack 120*b* is located on the substrate 110 and located in the periphery area 104 of the semiconductor device 100. The first gate spacer 130 includes the first portion 132 on the sidewall of the first film stack 120*a*, and includes the second portion 134 on the sidewall of the second film stack 120*b*. The buffer layer 140 includes the first portion 142 on the sidewall of the first portion 132 of the first gate spacer 130, and includes the second portion 144 on the sidewall of the second portion 134 of the first gate spacer 130. The second gate spacer 150 includes the first portion 152 on the sidewall of the first portion 142 of the buffer layer 140, and includes the second portion 154 on the sidewall the second portion 144 of the buffer layer 140. Furthermore, the first portion 142 of the buffer layer 140 is located between the first portion 132 of the first gate spacer 130 and the first portion 152 of the second gate spacer 150, and the second portion 144 of the buffer layer 140 is located between the second portion 134 of the first gate spacer 130 and the second portion 154 of the second gate spacer 150.

In some embodiments, the first portion 142 of the buffer layer 140 is in contact with the first portion 132 of the first gate spacer 130 and the first portion 152 of the second gate spacer 150. The second portion 144 of the buffer layer 140 is in contact with the second portion 134 of the first gate spacer 130 and the second portion 154 of the second gate spacer 150. The material of the buffer layer 140 is different from the material of the second gate spacer 150. For example, the material of the buffer layer 140 includes nitride, and the material of the second gate spacer 150 includes oxide.

In addition, each of the first film stack 120*a* and the second film stack 120*b* includes the poly layer 122, the metal stack 124, the dielectric layer 126, and the hard mask layer 128 that are stacked in sequence. The material of the buffer layer 140 is different from the material of the hard mask layer 128. For example, the material of the buffer layer 140 includes nitride, and the material of the hard mask layer 128 includes oxide. In some embodiments, the material of the hard mask layer 128 is the same as the material of the second gate spacer 150.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

a first film stack located on the substrate and located in an array area of the semiconductor device;

a second film stack located on the substrate and located in a periphery area of the semiconductor device;

a first gate spacer comprising a first portion on a sidewall of the first film stack and a second portion on a sidewall of the second film stack;

a buffer layer comprising a first portion on a sidewall of the first portion of the first gate spacer and a second portion on a sidewall of the second portion of the first gate spacer; and a second gate spacer comprising a first portion on a sidewall of the first portion of the buffer layer and a second portion on a sidewall the second portion of the buffer layer, wherein the first portion of the buffer layer is located between the first portion of the first gate spacer and the first portion of the second gate spacer, and the second portion of the buffer layer is located between the second portion of the first gate spacer and the second portion of the second gate spacer.

2. The semiconductor device of claim 1, wherein the first portion of the buffer layer is in contact with the first portion of the first gate spacer and the first portion of the second gate spacer.

3. The semiconductor device of claim 1, wherein the second portion of the buffer layer is in contact with the second portion of the first gate spacer and the second portion of the second gate spacer.

4. The semiconductor device of claim 1, wherein a material of the buffer layer is different from a material of the second gate spacer.

5. The semiconductor device of claim 4, wherein the material of the buffer layer comprises nitride, and the material of the second gate spacer comprises oxide.

6. The semiconductor device of claim 4, wherein the material of the buffer layer is the same as a material of the first gate spacer.

7. The semiconductor device of claim 6, wherein the material of the first gate spacer comprises nitride.

8. The semiconductor device of claim 1, wherein each of the first film stack and the second film stack comprises a poly layer, a metal stack, a dielectric layer, and a hard mask layer that are stacked in sequence.

9. The semiconductor device of claim 8, wherein a material of the hard mask layer comprises oxide.

10. The semiconductor device of claim 8, wherein a material of the hard mask layer is the same as a material of the second gate spacer.

11. The semiconductor device of claim 8, wherein a material of the hard mask layer is different from a material of the buffer layer.

12. The semiconductor device of claim 1, wherein the substrate comprises a plurality of shallow trench isolation structures therein.

* * * * *